(12) United States Patent
Horiuchi et al.

(10) Patent No.: US 6,297,553 B1
(45) Date of Patent: Oct. 2, 2001

(54) SEMICONDUCTOR DEVICE AND PROCESS FOR PRODUCING THE SAME

(75) Inventors: Michio Horiuchi; Kazunari Imai, both of Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 09/422,746

(22) Filed: Oct. 22, 1999

(30) Foreign Application Priority Data

Oct. 30, 1998 (JP) ................................................. 10-310804

(51) Int. Cl.$^7$ ........................... H01L 23/48; H01L 23/52; H01L 29/40
(52) U.S. Cl. ........................................... 257/737; 257/678
(58) Field of Search ................................... 257/676, 693, 257/700, 737, 774, 777, 786, 778, 779, 783, 678

(56) References Cited

U.S. PATENT DOCUMENTS

| 5,628,919 | 5/1997 | Tomura et al. . | |
|---|---|---|---|
| 5,886,409 | 3/1999 | Ishino et al. . | |
| 5,897,337 | * 4/1999 | Kata et al. | 438/114 |
| 6,011,310 | * 1/2000 | Naito et al. | 257/774 |
| 6,137,185 | * 10/2000 | Ishino et al. | 257/786 |
| 6,153,448 | * 11/2000 | Takahashi et al. | 438/118 |

FOREIGN PATENT DOCUMENTS

| 729 182 | 8/1996 | (EP) . |
| 918 354 | 5/1999 | (EP) . |
| 1-124293 | 5/1989 | (JP) . |

OTHER PUBLICATIONS

Patent Abstracts of Japan, Published Patent Application JP 09 199535, Electrode Structure of Semiconductor Intergrated Circuit and its Package Formation, (Hitachi Ltd; Hitachi Cable Ltd.), Jul. 31, 1997.

Patent Abstracts of Japan, Published Patent Application JP 10 26417, Manufacture of Semiconductor Package, (Citizen Watch Co. Ltd), Sep. 25, 1998.

Matsuda S. et al., "Simple–Structure, Generally Applicable Chip–Scale Package", Proceedings of the Electronic Components and Technology Conference, New York, USA, IEEE, vol. Conf. 45, May 21, 1995, pp. 218–223.

* cited by examiner

Primary Examiner—David Nelms
Assistant Examiner—David Nhu
(74) Attorney, Agent, or Firm—Staas & Halsey, LLP (57) ABSTRACT

A semiconductor device that meets the demand for realizing semiconductor chips in small sizes. A semiconductor device in which connection lands 20 formed on the electrode terminal carrying surface of a semiconductor chip 10 are electrically connected, through connection bumps 14, to connection pads 22 formed on one surface of an interposing substrate 12 of an insulating material so as to face the connection lands 20, wherein conductor wiring patterns 24 inclusive of the connection pads 22 are formed on one surface of the interposing substrate 12, conductor wiring patterns 30 inclusive of terminal lands on where the external connection terminals 26 will be mounted, are formed on the other surface of the interposing substrate 12, and the conductor wiring patterns 24 formed on one surface of the interposing substrate 12 are connected to the conductor wiring patterns 30 formed on the other surface of the interposing substrate 12 through vias 32 formed by filling recesses with a metal by plating, the recesses being formed to penetrate through the insulating material of the interposing substrate 12 and permitting the back surfaces of the conductor wiring patterns 24 on the side of the insulating material to be exposed on the bottom surfaces thereof.

2 Claims, 6 Drawing Sheets

SEMICONDUCTOR DEVICE AND PROCESS FOR PRODUCING THE SAME

BACKGROUND OF THE INVENTION

1. Field of the Invention

The present invention relates to a semiconductor device and a process for producing the same. More specifically, the invention relates to a semiconductor device of a small size, such as a chip-size package (CSP) or the like, which makes it possible to easily increase the number of the pins yet reduce the cost of production, and to a process for producing the same.

2. Description of the Related Art

The chip-size package (CSP) is a semiconductor device in which external connection terminals such as solder balls are formed on a mounting surface that is formed nearly the same size as the semiconductor chip. The semiconductor device is mounted on a mother board by using the external connection terminals.

Figure 1:
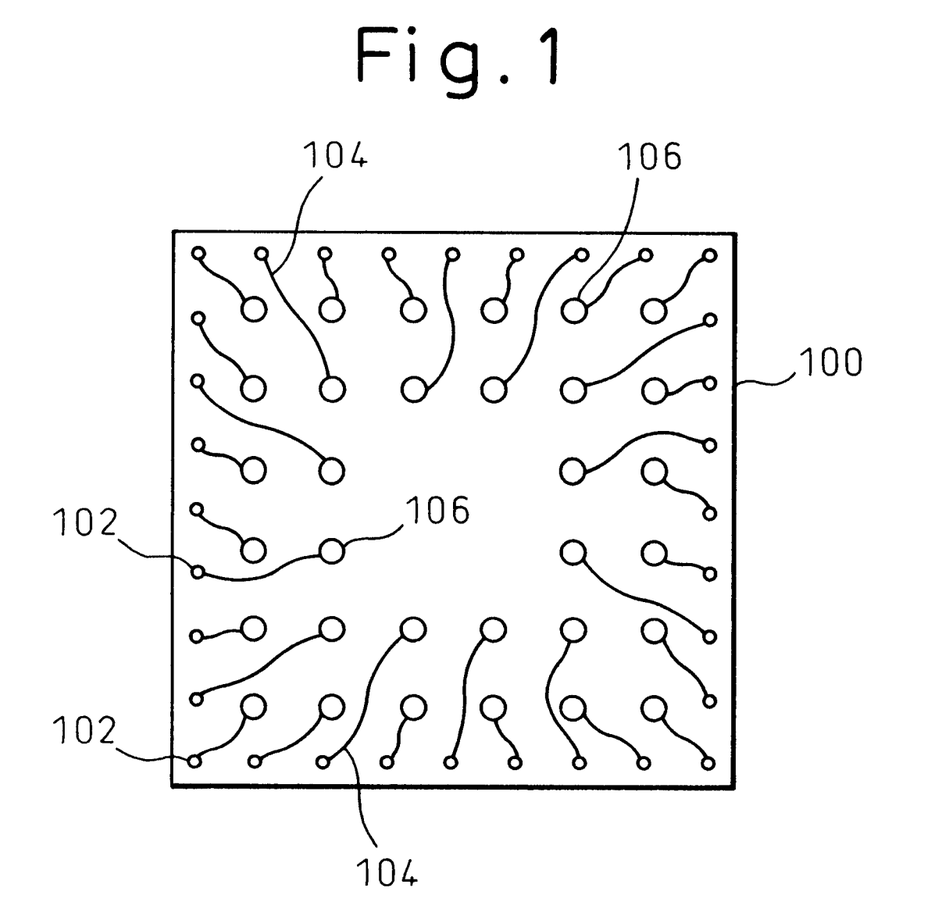
FIG. 1 is a plan view illustrating an electrode terminal carrying surface of a semiconductor chip.

In the chip-size package (CSP) as shown in FIG. 1, the electrode terminals 102 formed near the peripheral edges of the semiconductor chip 100 are electrically connected by wiring patterns 104 including lands 106 on which will be mounted the external connection terminals that are mounted on the mother board.

The wiring patterns 104 can be formed on a passivation film of the semiconductor chip 100, or can be formed by joining a wiring pattern film on which wiring patterns 104 are formed onto the passivation film of the semiconductor chip 100.

When a plurality of lands 106 are formed on the electrode terminal carrying surface of the semiconductor chip 100, space must be maintained for arranging outgoing lines among the neighboring lands. However, the terminal lands 106 to which are connected external connection terminals for mounting on the mother board must have a diameter of about 300 $\mu$m. Therefore, a limitation is imposed on the number of the terminal lands 106 formed on the electrode terminal carrying surface of the semiconductor chip.

In modern semiconductor devices, on the other hand, semiconductor chips are being fabricated in ever smaller sizes resulting in an increase in the density for forming the external connection terminals. As described above, however, a limitation is imposed on the number of the terminal lands when the terminal lands for mounting the external connection terminals are formed on the electrode terminal carrying surface of the semiconductor chip, making it difficult to meet the demand for realizing the semiconductor chips in small sizes.

SUMMARY OF THE INVENTION

The object of the present invention is to provide a semiconductor device capable of easily meeting the demand for realizing the semiconductor chips in small sizes, and a process for producing the same.

In order to achieve the object, the present inventors have attempted to form the terminal lands for mounting the external connection terminals on an interposing substrate formed separately from the semiconductor chip, and to electrically connect the interposing substrate to the semiconductor chip using connection bumps smaller than the external connection terminals. As a result, the inventors have learned that the connection lands can be formed on the electrode terminal carrying surface of the semiconductor chip, the connection lands having a diameter smaller than that of the terminal lands for mounting the external connection terminals.

Further, vias for electrically connecting together the conductor wiring patterns formed on both surfaces of the interposing substrate, are formed by filling the recesses with a metal by plating, the recesses penetrating through the insulating material of the interposing substrate in such a manner that the back surface of the conductor wiring pattern on one surface of the insulating material and on the side of the insulating material is exposed on the bottom surface of the recess. Thus, very fine vias are formed and the connection lands are formed having a further decreased diameter on the interposing substrate. This makes it possible to form the connection lands having a further decreased diameter on the electrode carrying surface of the semiconductor chip connected, via connection bumps, to the connection lands of the interposing substrate and, hence, to fully meet the demand for realizing the semiconductor chips in small sizes. The inventors have thus arrived at the present invention.

According to the present invention, there is provided a semiconductor device comprising:

a semiconductor chip having an electrode terminal carrying surface on which electrode terminals and conductor lands electrically connected to the electrode terminals are formed;

an interposing substrate of an insulating material having a front surface and a back surface and disposed with the front surface facing the electrode terminal carrying surface of the semiconductor chip, in which a conductor wiring pattern including conductor pads is formed on the front surface, a conductor wiring pattern including conductor lands is formed on the back surface, external connection terminals are formed on the conductor lands on the back surface, and conductor vias composed of a plated metal filling viaholes extending through the interposing substrate electrically connect the conductor wiring pattern on the front surface and the conductor wiring pattern on the back surface; and bumps electrically connecting the conductor lands of the semiconductor chip to the conductor pads of the interposing substrate.

In the semiconductor device according to the present invention, the conductor wiring pattern on the back surface is advantageously adhered to the back surface by a thermoplastic adhesive agent layer intervening therebetween to facilitate production of the device.

According to the present invention, there is also provided a process of producing a semiconductor device, comprising the steps of:

providing an insulating material having a front surface coated with a metal foil bonded thereto and a back surface coated with a thermoplastic adhesive agent layer formed thereon;

forming recesses extending through the insulating material, the recesses having a bottom defined by the metal foil at the front surface and an opening at the back surface;

filling the recesses with a metal by electrolytic plating using the metal foil as a current supply path to form conductor vias extending through the insulating material;

adhering a metal foil to the back surface of the insulating material with the thermoplastic adhesive agent layer;

patterning the metal foils on the front surface and the back surface to form conductor wiring patterns on the front surface and the back surface, respectively, thereby forming an interposing substrate having the front surface on which a conductor wiring pattern including conductor pads for connection to conductor lands on an electrode terminal carrying surface of a semiconductor chip is formed and having the back surface on which a conductor wiring pattern including conductor lands for external connection terminals is formed, the conductor wiring patterns being electrically connected to each other through the conductor vias;

bonding and electrically connecting the conductor lands of the semiconductor chip to the conductor pads of the interposing substrate by bumps; and forming external connection terminals on the conductor lands of the interposing substrate.

In the process according to the present invention, the steps subsequent to the step of patterning the metal foils may be replaced by the following steps:

using, instead of the semiconductor chip, a semiconductor wafer including plural semiconductor chip regions each corresponding to the semiconductor chip and having conductor lands corresponding to those of the semiconductor chip;

forming external connection terminals on the conductor lands of the interposing substrate; and cutting, before or after the step of forming external connection terminals, the semiconductor wafer and the interposing substrate, which have been bonded together, at positions between the semiconductor chip regions.

According to the process for producing a semiconductor device of the present invention, recesses are formed by laser beam machining so as to penetrate through the insulating material so that the back surface of the metal foil on the side of the insulating material is exposed on the bottom surface. This makes it possible to form recesses having a diameter smaller than that of the recesses formed by etching or the like method.

Further, the vias are formed of a low melting point alloy having a melting point of not higher than 300° C., so that, during patterning the metal foils, after the vias are formed, the vias exhibit resistance against the etching solution for the metal foils.

According to the present invention, the terminal lands for mounting the external connection terminals are formed on the interposing substrate formed separately from the semiconductor chip, and the interposing substrate and the semiconductor chip can be electrically connected together using connection bumps that are smaller than the external connection terminals. Therefore, the connection lands of a diameter smaller than the terminal lands for mounting the external connection terminals can be formed on the electrode carrying surface of the semiconductor chip.

Besides, the vias are formed by filling the recesses with a metal by plating and the recesses penetrate through the insulating material in such a manner that the back surface of the metal foil on the side of the insulating material is exposed on the bottom surface of the recess. This makes it possible to form very fine vias compared to when the vias are formed by filling the recesses with an electrically conducting paste and, hence, to form, on the interposing substrate, the connection pads capable of mounting a semiconductor chip having small connection lands formed on the electrode carrying surface.

Further, since the vias are formed by metal plating, the connection pads and terminal lands can be formed right on the vias, enabling the conductor wiring patterns to be highly densely formed.

As a result, the terminal lands are very densely formed on the electrode terminal carrying surface of the semiconductor chip as compared to when the terminal lands are formed for mounting the external connection terminals, meeting the demand for realizing the semiconductor chips in small sizes.

BRIEF DESCRIPTION OF THE DRAWINGS

FIGS. 8(a1) to 8(b2) are plan views (a1, b1) and sectional views (a2, b2) illustrating the vias formed by simply plating the inner walls of the via holes in contrast with the vias formed by filling the via holes with a plated metal according to the present invention.

DESCRIPTION OF THE PREFERRED EMBODIMENTS

Figure 2:
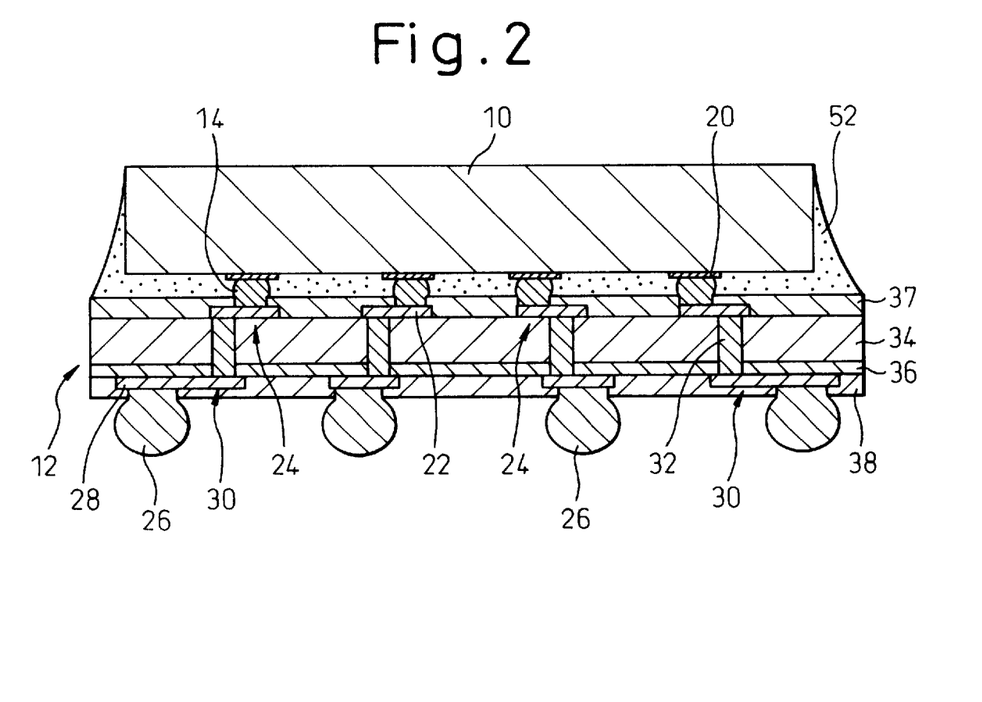
FIG. 2 is a sectional view of a semiconductor device according to the present invention.

FIG. 2 shows a semiconductor device according to the present invention in a sectional view. A semiconductor chip 10 cut from a wafer is electrically connected to an interposing substrate 12 through connection bumps 14.

Figure 3:
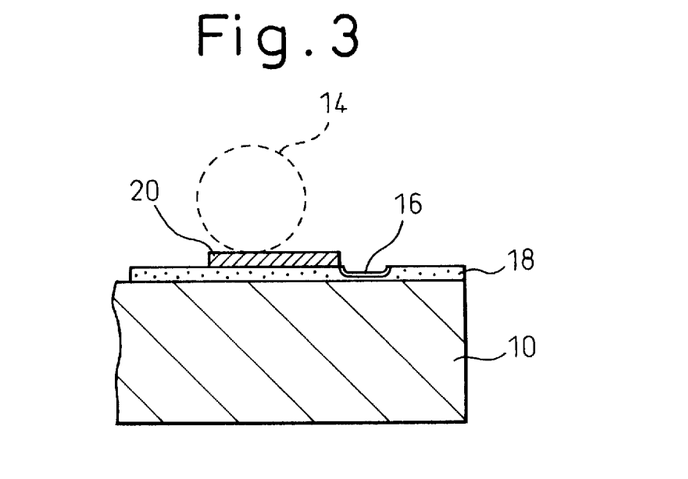
FIG. 3 is a partial sectional view of a semiconductor chip 10 shown in FIG. 2.

In the semiconductor device shown in FIG. 2, the connection surface of the semiconductor chip 10 connected to the interposing substrate 12 serves as an electrode terminal carrying surface on which electrode terminals 16 are formed as shown in FIG. 3. Connection lands 20 electrically connected to the electrode terminals 16 are formed on a passivation film 18 on the electrode terminal carrying surface of the semiconductor chip 10. The connection bumps 14 mounted on the interposing substrate 12 are connected to the connection lands 20.

In FIG. 3, the connection lands 20 are formed separately from the electrode terminals 16. Here, however, the electrode terminals 16 may also serve as connection lands 20.

The interposing substrate 12 connected to the semiconductor chip 10 via the connection bumps 14 has conductor wiring patterns 24 including connection pads 22 formed on one surface thereof facing the electrode terminal carrying surface of the semiconductor chip 10. The interposing substrate 12 further has conductor wiring patterns 30 formed on the other surface thereof, the conductor wiring patterns 30 including terminal lands 28 on which will be mounted the external connection terminals 26.

The insulating material forming the interposing substrate 12 comprises chiefly a film 34 such as of polyimide, and has a thermoplastic adhesive agent layer 36 formed on one surface of the film 34. The thermoplastic adhesive agent layer 36 joins the conductor wiring patterns 30 including the terminal lands 28 to the film 34.

It is desired that the thermoplastic adhesive agent layer 36 is formed of a thermoplastic adhesive agent having a Young's modulus of not higher than 500 MPa at room temperature. When mounted on the mother board, the semiconductor device shown in FIG. 2 having the thermoplastic adhesive agent layer 36 composed of the thermoplastic adhesive agent having such a low Young's modulus, absorbs the stress caused by a difference in the coefficient of thermal expansion from the mother board as the thermoplastic adhesive agent layer 36 undergoes the deformation yet maintaining a dimensional stability relying on the film 34.

As the thermoplastic adhesive agent having a Young's modulus of not higher than 500 MPa at room temperature, there can be used a thermoplastic polyolefin resin or a polyimide resin.

The conductor wiring patterns 24 formed on one surface of the interposing substrate 12 comprising the insulating materials of film 34 and thermoplastic adhesive agent layer 36, are electrically connected, through vias 32, to the conductor wiring patterns 30 formed on the other surface of the interposing substrate 12. The vias 32 are formed by filling the recesses with a metal by metal plating, the recesses penetrating through the insulating material of the interposing substrate 12 and permitting the back surfaces of either the conductor wiring patterns 24 or the conductor wiring patterns 30 on the side of the insulating material to be exposed on the bottom surfaces of the recesses. Therefore, the connection pads 22 and the terminal lands 28 can be formed right on the vias 32 of the interposing substrate 12 shown in FIG. 2, thereby to highly densely form the conductor wiring patterns 24 and 30.

It is further desired that the vias 32 are formed of a low melting point alloy having a melting point of not higher than 300° C., such as a tin-lead eutectic alloy (solder).

Solder resists 37 and 38 are applied onto both surfaces of the interposing substrate 12 except the portions where the connection pads 22, connection bumps 14 for the terminal lands 28 and external connection terminals are connected.

The interposing substrate 12 used for the semiconductor device shown in FIG. 2 can be formed by a method shown in FIGS. 4(a)–4(f).

Figure 4A:
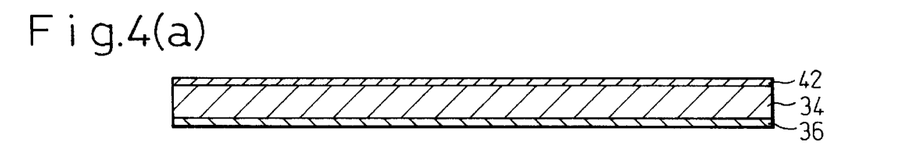
FIGS. 4(a) to 4(f) are sectional views illustrating the steps for producing an interposing substrate that constitutes the semiconductor device shown in FIG. 2.

As shown in FIG. 4(a), the insulating material forming the interposing substrate 12 comprises a film 34 such as of polyimide having a metal foil 42 such as copper foil formed on one surface thereof and a thermoplastic adhesive agent layer 36 formed on the other surface thereof.

Figure 4B:
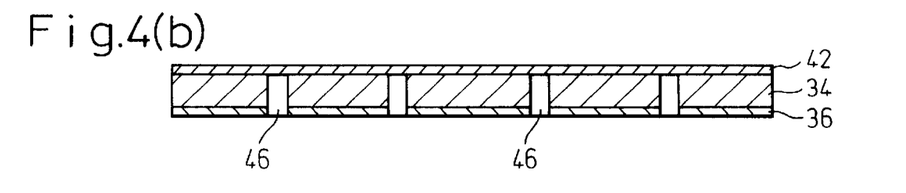

Recesses 46 are formed by laser beam machining in the insulating material, the recesses opening in one surface thereof and permitting the back surface of the metal foil 42 to be exposed on the bottom surfaces thereof [FIG. 4(b)]. The laser beam machining makes it possible to form the recesses 46 which are finer than the recesses formed by etching or the like method.

Figure 4C:
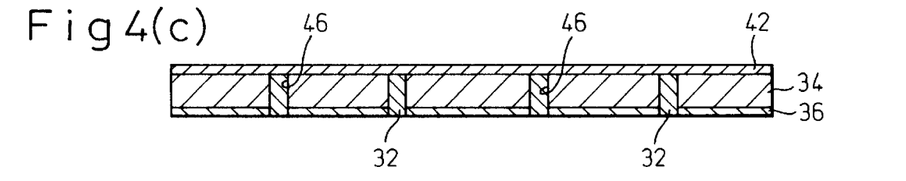

The recesses 46 are filled with a metal by electrolytic plating using the metal foil 42 as a current supply layer [FIG. 4(c)]. It is desired that the metal is a low melting point alloy having a melting point of not higher than 300° C., such as a tin-lead eutectic alloy (solder). When very fine recesses 46 are formed by laser beam machining, extreme difficulty is involved in filling such very fine recesses 46 with the electrically conducting paste.

Figure 4D:
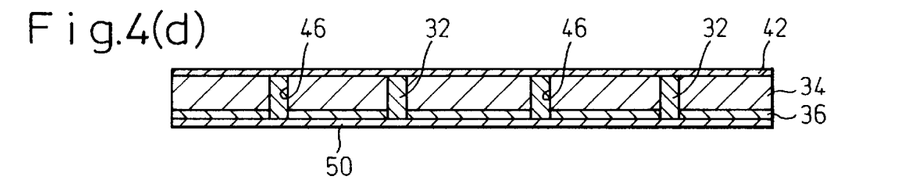

Then, a metal foil 50 such as copper foil is adhered with a thermoplastic adhesive agent layer 36 onto the insulating material in which the vias 32 are formed by filling the recesses 46 with a metal by electrolytic plating [FIG. 4(d)]. At the time of filling the recesses 46 with the metal by electrolytic plating, the thermoplastic adhesive agent layer 36 is immersed in the electrolytic plating solution but still exhibits its adhering ability to a sufficient degree. When a thermosetting adhesive agent layer is formed instead of the thermoplastic adhesive agent layer 36, the adhering ability of the thermosetting adhesive agent layer is often lost when it is immersed in the electrolytic plating solution. When the vias 32 are formed of a tin-lead eutectic alloy (solder), a metal foil 50 such as copper foil can be favorably joined.

Figure 4E:
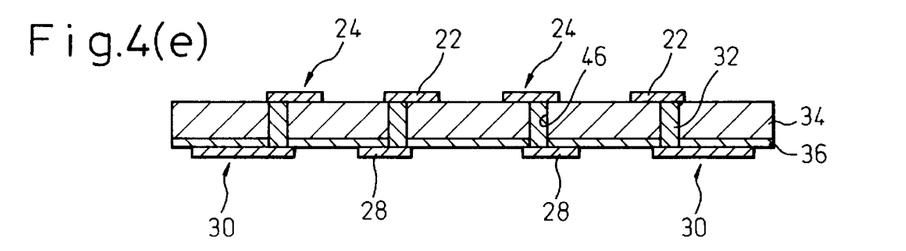

The metal foils 42 and 50 formed on both surfaces of the insulating material are patterned by the photolithographic method, thereby to form the conductor wiring patterns 24 including the connection pads 22 and the conductor wiring patterns 30 including the terminal lands 28 [FIG. 4(e)]. When the vias 32 are formed of the tin-lead eutectic alloy (solder), the metal forming the vias 32 is prevented from being etched by the etching solution at the time of patterning the metal foils 42 and 50 despite the end surfaces of the vias 32 partly appearing through the wiring patterns 24 and 22.

In FIG. 4(e), the conductor wiring patterns 24 are formed of the metal foil 42 and the conductor wiring patterns 30 are formed of the metal foil 50. It is, however, also allowable to form the wiring patterns 30 using the metal foil 42 and the wiring patterns 24 using the metal foil 50.

Figure 4F:
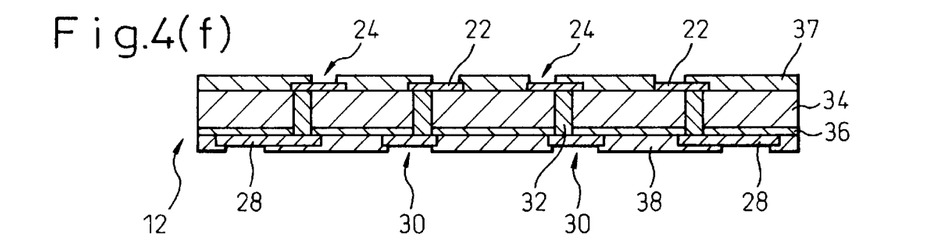

In order to protect the conductor wiring patterns 24 and 30, further, the interposing substrate 12 may be obtained by applying the solder resists 37 and 38 onto both surfaces of the insulating material except the connection pads 22 and the terminal lands 28 [FIG. 4(f)].

Thereafter, the connection lands 20 of the semiconductor chip 10 are brought into contact with the connection bumps 14 mounted on the connection pads 22 of the obtained interposing substrate 12, followed by reflowing, to connect the interposing substrate 12 and the semiconductor chip 10 together. A gap between the thus connected semiconductor chip 10 and the interposing substrate 12 may be filled with an under-fill 52 as shown in FIG. 2.

Then, the external connection terminals are mounted on the terminal lands 28 of the interposing substrate 12 to obtain the semiconductor device shown in FIG. 2.

In the foregoing description, the connection bumps 14 were mounted on the connection pads 22 of the interposing substrate 12 and were, then, connected to the connection lands 20 of the semiconductor chip 10. However, the connection bumps 14 mounted on the connection lands 20 of the semiconductor chip 10 may be connected to the connection pads 22 of the interposing substrate 12.

In the semiconductor device shown in FIGS. 2, 3 and 4(a)–4(f), the connection bumps 14 smaller than the external connection terminals 26 are connected to the connection lands formed on the electrode terminal carrying surface of the semiconductor chip 10. Therefore, the connection lands 20 are formed having a diameter smaller than that of the terminal lands 28 on which the external connection terminals 26 are mounted.

Further, the vias 32 formed in the interposing substrate 12 connected to the semiconductor chip 10 are formed more finely than the vias formed by being filled with the electrically conducting paste, making it possible to decrease the diameter of the connection pads 22 of the interposing substrate 12 connected to the connection lands 20 of the semiconductor chip 10 via the connection bumps 14. Despite the semiconductor chip 10 being formed in a small size and the connection lands 20 of a decreased diameter being highly densely formed, the semiconductor chip having a small size can be mounted on the interposing substrate 12.

The foregoing description has dealt with the method of producing the semiconductor devices by using individual semiconductor chips 10. According to the present invention, however, the semiconductor devices can be further obtained even by joining a wafer before being cut into individual semiconductor chips 10 onto the interposing substrate and, then, cutting the wafer into the individual chips 10. This process will now be described with reference to FIGS. 5(a)–5(c).

Figures 5A, 5B, 5C:
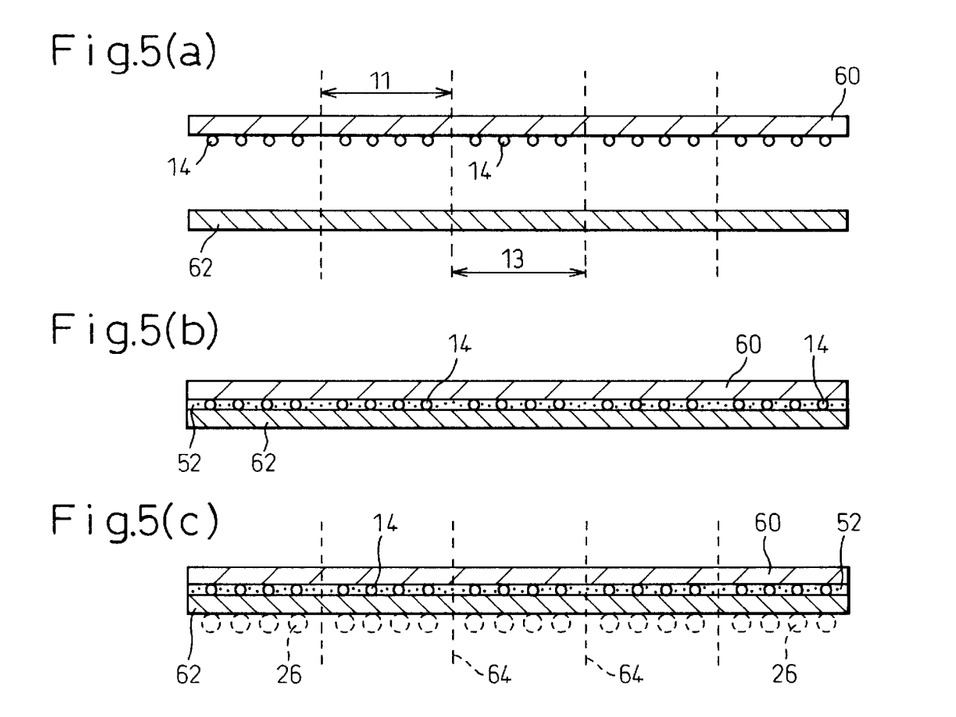
FIGS. 5(a) to 5(c) are sectional views illustrating other steps for producing the semiconductor device according to the present invention.

As shown in FIG. 5(a), first, there are provided a wafer 60 having a plurality of semiconductor chip regions 11 each corresponding to the semiconductor chip 10 shown in FIG. 2, and a plate-like interposing substrate aggregate 62 having a plurality of interposing substrate regions 13 each corresponding to the interposing substrate 12 of FIG. 4(f), and the two are so positioned that the semiconductor chip regions 11 correspond to the interposing substrate regions 13.

Here, in FIG. 5(a), connection bumps 14 formed of a solder or the like are mounted on the connection lands 20 of the semiconductor chip regions 11. Therefore, the wafer 60 and the interposing substrate aggregate 62 are so positioned that the connection pads 22 of the interposing substrate regions 13 are corresponded to the connection bumps 14.

The connection bumps 14 may be mounted on the connection pads 22 formed on the interposing substrate regions 13 of the interposing substrate aggregate 62.

Next, the wafer 60 and the interposing substrate aggregate 62 are completely connected together by reflowing or the like, the wafer 60 and the interposing substrate aggregate 62 having been so positioned that the connection lands 20 of the semiconductor chip regions 11 are electrically connected, through the connection bumps 14, to the connection pads 22 of the interposing substrate regions 13.

Then, as shown in FIG. 5(b), a gap between the wafer 60 and the interposing substrate aggregate 62 is filled with the under-filling material 52 and, as required, as shown in FIG. 5(c), the external connection terminals 26 are mounted on the terminal lands 28 of the interposing substrate regions 13. Thereafter, the laminate is cut at positions of dotted lines 64, into individual pieces comprising the semiconductor chip region 11 and the interposing substrate region 13 that are joined together in order to obtain semiconductor devices, one of which is shown in FIG. 6.

Figure 6:
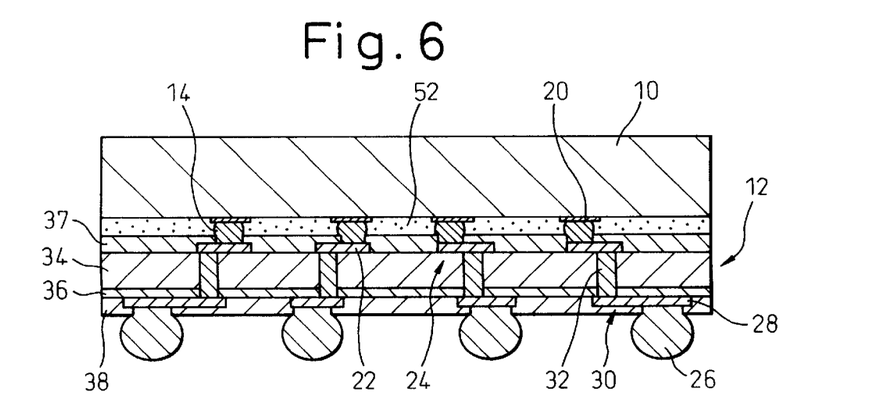
FIG. 6 is a sectional view illustrating the semiconductor device obtained through the production steps shown in FIG. 5.

The thus obtained semiconductor device shown in FIG. 6 has substantially the same structure as the semiconductor device shown in FIG. 2 except that the semiconductor chip 10 has the same size as the interposing substrate 12.

The external connection terminals 26 may be mounted after the laminate is cut at positions of dotted lines 64, and the semiconductor chip regions 11 and the interposing substrate regions 13 may be individually joined together.

EXAMPLE

A thermoplastic adhesive agent layer 36 was formed by laminating a thermoplastic adhesive agent film of a thickness of 35 μm on one surface of a 25 μm-thick polyimide film 34 having, as a metal foil 42, a 12 μm-thick copper foil formed on the other surface thereof. The thermoplastic adhesive agent layer 36 was irradiated with a UV-YAG laser beam to form recesses 46 having an inner diameter of about 50 μm that were opened on the side of the thermoplastic adhesive agent layer 36 permitting the back surface of the copper foil to be exposed on the bottom surfaces thereof.

Then, the thus formed recesses 46 were filled with a tin-lead eutectic alloy (solder) by electrolytic plating using the copper foil as a current supply layer to form vias 32 to which were joined at a metal foil 50, as an 18 μm-thick copper foil, using the thermoplastic adhesive agent layer 36.

Then, the copper foils joined to both surfaces of the insulating material comprising the polyimide film 34 and the thermoplastic adhesive agent layer 36, were patterned by the photolithographic method or the like method to form conductor wiring patterns. The conductor wiring patterns were the conductor wiring patterns 24 including the connection pads 22 and the conductor wiring patterns 30 including the terminal lands 28. The connection pads 22 possessed a diameter smaller than that of the terminal lands 28.

Thereafter, in order to protect the conductor wiring patterns 24 and 30, the solder resists 37 and 38 were applied to both surfaces of the insulating material except the connection pads 22 and the terminal lands 28, to obtain an interposing substrate aggregate 62 on which a plurality of interposing substrate regions 13 have been formed.

The wafer 60 and the interposing substrate aggregate 62 were positioned in such a manner that the connection bumps 14 of a solder mounted on the connection lands 20 of the semiconductor chip regions 13 formed on the wafer 60, before being cut into individual semiconductor chips 10, were brought into contact with the connection pads 22 of the interposing substrate aggregate 62, followed by reflowing, in order to join the connection bumps 14 to the connection pads 22.

Further, a gap between the wafer 60 and the interposing substrate 12 was filled with an under-filling material 52 comprising an epoxy resin filler. The laminate was then cut into individual pieces and, then, the external connection terminals 26 comprising solder balls were mounted on the terminal lands 28 to obtain the semiconductor devices.

The thus obtained semiconductor device possessed a rectangular semiconductor chip 10 measuring 15 mm×15 mm mounted on the interposing substrate 12 of the same shape, the interposing substrate being provided with 900 external connection terminals 26.

COMPARATIVE EXAMPLE

In Example 1, it was attempted to form the vias by filling the recesses 46 having an inner diameter of about 50 μm with an electrically conducting paste. However, the recesses were not sufficiently filled with the electrically conducting paste of a thermoplastic resin in which a silver filler had been mixed, and the formation of the vias was abandoned. The recesses could be filled with the electrically conducting paste to a sufficient degree when they possessed an inner diameter of about 80 μm.

The recesses having an inner diameter of about 80 μm could be formed by forming through holes of an inner diameter of about 80 μm in the polyimide film 34 by punching and, then, joining a metal foil onto one surface of the polyimide film 34.

According to the present invention, the vias are formed as solid members by filling the viaholes penetrating through the interposing substrate with a plated metal, offering the following advantages compared with when the vias are formed as hollow members by simply plating the metal on the inner walls of the viaholes.

Figure 7A:
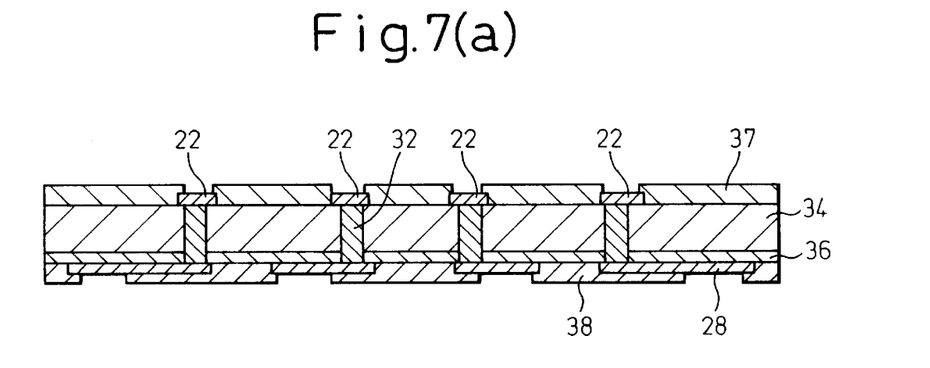
FIGS. 7(a) and 7(b) are sectional views illustrating the steps for producing the semiconductor device having connection pads formed on the vias according to the present invention.
Figure 7B:
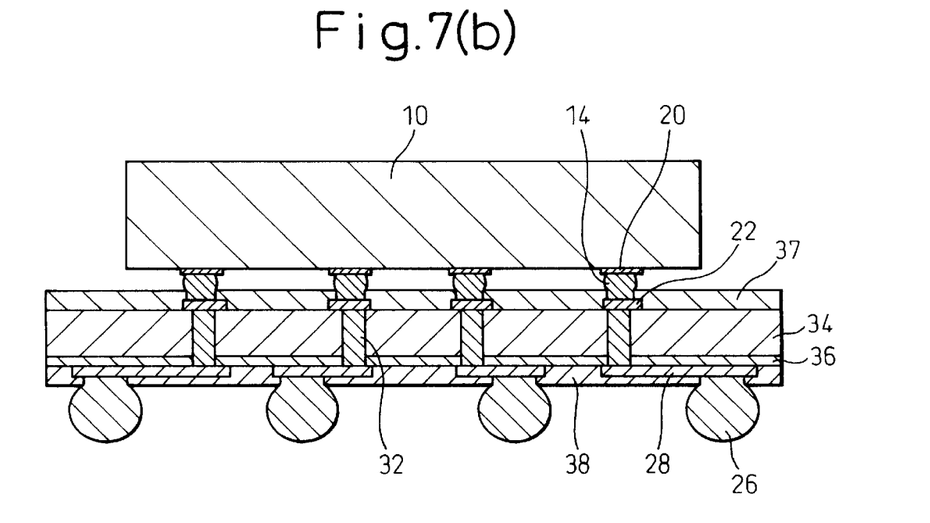
Figure 8:
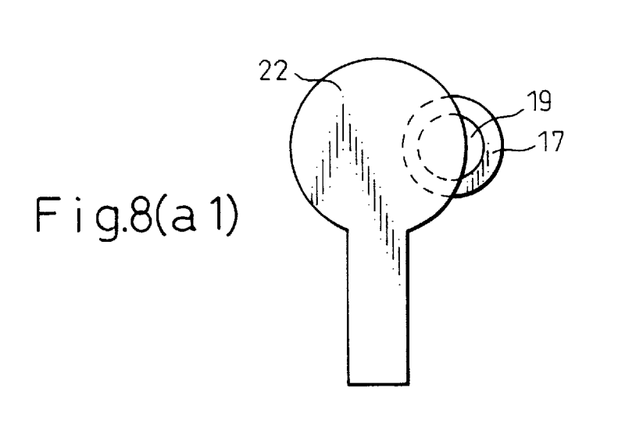

First, the vias of the present invention are solid members enabling the pads for connection to the semiconductor chip to be formed thereon. In the case of the hollow vias formed by plating the metal on only the inner walls of the viaholes, it is not possible to form the pads on the vias since the central portions thereof are cavities. According to the present invention, the step of, for example, FIG. 4(f) may be modified to form the connection pads 22 right on the solid vias 32 as shown in FIG. 7(a), and the connection to the semiconductor chip 10 is accomplished by the connection bumps 14 formed thereon as shown in FIG. 7(b).

Besides, the vias according to the present invention are solid members and are not broken even when the positions are deviated during the patterning of the conductor wiring patterns including the pads. In the case of the hollow vias as shown in a plan view and a sectional view of FIGS. 8(a1) and 8(a2), when the positions are greatly deviated during the patterning of the conductor wiring patterns and the pads 22 are not completely superposed on the vias 17, cavities 19 at the central portions are exposed, whereby the vias 17 in the form of a plated film are corroded with the etching solution resulting in the occurrence of breakage. According to the present invention, as shown in a plan view and a sectional view of FIGS. 8(b1) and 8(b2), on the other hand, the vias 14 are not corroded with the etching solution even when the positions are greatly deviated during the patterning of the conductor wiring patterns causing the pads 22 to be not completely superposed on the vias 14.

The present invention cheaply provides a semiconductor device which is light in weight and small in size, meeting the demand for fabricating semiconductor chips in small sizes.

What is claimed is:

1. A semiconductor device comprising:

a semiconductor chip having an electrode terminal carrying surface on which electrode terminals and conductor lands electrically connected to the electrode terminals are formed;

an interposing substrate of an insulating material having a front surface and a back surface and disposed with the front surface facing the electrode terminal carrying surface of the semiconductor chip, in which a conductor wiring pattern, including conductor pads, is formed on the front surface, a conductor wiring pattern, including conductor lands having a larger surface area than said conductor pads, is formed on the back surface, external connection terminals are formed on the conductor lands on the back surface, and conductor vias formed by electrolytic plating to fill viaholes with an alloy having a melting point of no more than 300° Celsius, extending through the interposing substrate electrically connecting the conductor wiring pattern on the front surface and the conductor wiring pattern on the back surface, at least one of the conductor wiring pattern on the front surface and the conductor wiring pattern on the back surface being adhered to the interposing substrate by a thermoplastic adhesive agent layer; and bumps electrically connecting the conductor lands of the semiconductor chip to the conductor pads of the interposing substrate.

2. A semiconductor device according to claim 1, wherein the conductor pads are formed on the conductor vias.

* * * * *